United States Patent
Nagai et al.

(10) Patent No.: US 6,826,031 B2
(45) Date of Patent: Nov. 30, 2004

(54) CERAMIC ELECTRONIC COMPONENT AND PRODUCTION METHOD THEREFOR

(75) Inventors: Atsushi Nagai, Aichi (JP); Minoru Sato, Tokyo (JP)

(73) Assignees: Noritake Co., Limited, Nagoya (JP); TDK Corporation, Tokyo (JP)

( * ) Notice: Subject to any disclaimer, the term of this patent is extended or adjusted under 35 U.S.C. 154(b) by 0 days.

(21) Appl. No.: 10/467,484
(22) PCT Filed: Sep. 5, 2002
(86) PCT No.: PCT/JP02/09044

§ 371 (c)(1),
(2), (4) Date: Aug. 8, 2003

(87) PCT Pub. No.: WO03/024168
PCT Pub. Date: Mar. 20, 2003

(65) Prior Publication Data
US 2004/0070915 A1 Apr. 15, 2004

(30) Foreign Application Priority Data
Sep. 6, 2001 (JP) ........................ 2001-269772

(51) Int. Cl.[7] .................... H01G 4/008; H01G 4/30; H01G 4/06
(52) U.S. Cl. .................... 361/305; 361/301.4; 361/311; 29/25.42
(58) Field of Search ............... 361/304–305, 361/306.1, 306.2, 306.3, 307, 308.1, 309, 311, 312–313, 301.4; 29/25.42

(56) References Cited

U.S. PATENT DOCUMENTS

| | | | | |
|---|---|---|---|---|
| 5,126,915 A | * | 6/1992 | Pepin et al. | 361/304 |
| 5,414,589 A | * | 5/1995 | Amano et al. | 361/306.3 |
| 6,265,090 B1 | * | 7/2001 | Nishide et al. | 428/701 |
| 6,488,869 B2 | | 12/2002 | Takezawa et al. | |
| 6,556,419 B2 | * | 4/2003 | Suzuki et al. | 361/303 |
| 6,569,367 B1 | | 5/2003 | Okuyama et al. | |

FOREIGN PATENT DOCUMENTS

| | | | | |
|---|---|---|---|---|
| JP | 58-110024 | * | 6/1983 | H01G/4/12 |
| JP | 61-179802 | | 8/1986 | |

(List continued on next page.)

*Primary Examiner*—Eric Thomas
(74) *Attorney, Agent, or Firm*—Oliff & Berridge, PLC

(57) ABSTRACT

A ceramic electronic component (20) having surface conductor films (23) and side-surface conductor films (24) excellent in burning shrinkage, bonding strength, solder heat resistance, solder wettability and the like. A method of producing a ceramic electronic component which uses a conductive paste containing as a main component Ag-based metal powder, the surface of the metal powder being coated with an organic metal compound or a metal oxide having as a constituting element any one selected from Al, Zr, Ti, Y, Ca, Mg and Zn, to form conductor films (23, 24 25) on a ceramic base material (21). A side-surface conductor film-forming paste differs form a surface conductor film-forming paste in that (1) the former paste has a relatively small coating amount of the organic metal compound or metal oxide and/or (2) contains either at least one kind of inorganic oxide powder as an accessory composition or a comparatively high percentage of the inorganic oxide powder.

13 Claims, 6 Drawing Sheets

FOREIGN PATENT DOCUMENTS

| | | | |
|---|---|---|---|
| JP | 63-216204 | 9/1988 | |
| JP | 3-20341 | 1/1991 | |
| JP | 3-297007 | 12/1991 | |
| JP | 4-206612 | 7/1992 | |
| JP | 6-240183 | 8/1994 | |
| JP | 7-62275 | 3/1995 | |
| JP | 7-197103 | 8/1995 | |
| JP | 7-242845 | 9/1995 | |
| JP | 8-7644 | 1/1996 | |
| JP | 8-181514 | 7/1996 | |
| JP | 8-259847 | 10/1996 | |
| JP | 9-194668 | 7/1997 | |
| JP | 9-129028 | * 9/1997 | ............ H01B/1/00 |
| JP | 10-75066 | * 3/1998 | ............ H05K/3/46 |
| JP | 11-111052 | 4/1999 | |
| JP | 11-163487 | 6/1999 | |
| JP | 11-191502 | 7/1999 | |
| JP | 11-191517 | 7/1999 | |
| JP | 2000-68105 | 3/2000 | |
| JP | 2000-265202 | 9/2000 | |
| JP | 2000-331535 | * 11/2000 | ............ H01B/1/22 |
| JP | 2001-23438 | 1/2001 | |
| JP | 2001-217545 | * 8/2001 | ............ H05K/3/46 |
| JP | 2002-76639 | 3/2002 | |

\* cited by examiner

CERAMIC ELECTRONIC COMPONENT AND PRODUCTION METHOD THEREFOR

TECHNICAL FIELD

The present invention relates to conductor compositions prepared in the form of paste or ink used to form film conductors on a ceramic base material such as a ceramic substrate. The present invention also relates to multilayer ceramic capacitors and other ceramic electronic components produced with the conductor compositions and a method for producing the same.

BACKGROUND ART

In compact and multifunctional electronic products such as mobile telephones, a large number of compact and precise ceramic electronic components such as hybrid ICs, multilayer capacitors, and multichip modules are used. FIG. 9 shows a schematic diagram of production procedure of a so-called multilayer circuit board 10 (e.g., low temperature sintered chip antenna switch module used for mobile telephones or the like) as a typical example of such highly functional ceramic electronic components.

First, a paste- or ink-like conductor composition (hereinafter, the compositions in these forms are collectively referred to as "conductor paste") is applied to a sheet-like ceramic substance (green sheet) 11a prepared with a doctor blade or the like, and a film conductor 12e with a predetermined pattern made of the conducting component of the composition is formed ((A) in FIG. 9).

Then, a plurality of green sheets 11a, 11b, 11c, 11d, and 11e (including those in which film conductors 12b, 12c, 12d, and 12e having various patterns are previously formed) are pressed while being superposed in such a manner that the film conductors 12b, 12c, 12d, and 12e are buried inside ((B) and (C) in FIG. 9). Thus, a multilayer ceramic base material II provided the film conductors having a predetermined pattern as inner layers (hereinafter referred to as "inner film conductors) can be obtained.

Then, the conductor paste is applied onto the surface (outer surface) of the multilayer ceramic base material 11, so that a film conductor 13 with a predetermined pattern made of the composition is formed (hereinafter referred to as a "surface film conductor"). Thereafter, the multilayer ceramic base material 11 in which the surface film conductor and the inner film conductors are formed is fired at a predetermined temperature, and thus the surface film conductor 13 and the inner film conductors 12b, 12c, 12d, and 12e are printed onto the ceramic base material 11 ((D) of FIG. 9).

After firing, the conductor paste is applied onto the side face (any one of the faces (end faces) adjacent to the surface on which the surface film conductor is formed, which also applies to the following) of the ceramic base material 11, and a film conductor 14 (hereinafter, referred to as "side film conductor") having a predetermined pattern is formed. Thereafter, the multilayer ceramic base material 11 is heated so that the side film conductor 14 is fired for printing ((E) of FIG. 9). In general, nickel (Ni) plating for the purpose of preventing so-called solder leaching (solder penetration) and tin (Sn) plating for the purpose of providing solder wettability (adherence with solder) are performed with respect to the fired and attached surface film conductor 13 and side film conductor 14 ((F) in FIG. 9).

Then, predetermined elements 15 are mounted on the surface of the plated multilayer ceramic base material 11.

This series of processes provides a multilayer circuit board (chip module) 10 ((G) in FIG. 9). Thus, the circuit board as well as other electronic components 2, 3, and 4 are mounted in a mother board 5 and thus a further higher order electronic product 1 is assembled ((H) in FIG. 9).

The conductor composition containing silver (Ag) or an Ag-based alloy in the form of a conductor metal powder (which may be referred to simply as "Ag paste" in the following) is widely used as the conductor paste to form the film conductor in the ceramic electronic component such as the circuit board (chip module) 10. Ag is less expensive than gold (Au), platinum (Pt), palladium (Pd) or the like, and has a lower electrical resistivity than those metals, so that it is advantageous to use Ag to form film conductors in various electronic components. For example, Japanese Laid-Open Patent Publication No. 8-181514 discloses a method for producing a ceramic electronic component for high-frequency applications characterized in that the Ag paste is used to form the inner film conductors (internal electrodes) and the surface film conductor (external electrode).

In recent years, Ag pastes having better properties than those of a conventional one have been under in-depth development. For example, Japanese Laid-Open Patent Publication No. 11-163487 (Japanese Patent No. 3150932) discloses an Ag paste that can form a film conductor having only a small extent of bending even if it is fired together with ceramic green sheets. Japanese Laid-Open Patent Publication No. 2001-23438 discloses an Ag paste having an improved bond strength with respect to the ceramic base material. Japanese Laid-Open Patent Publication No. 11-111052 discloses an Ag paste having good solder wettability. Japanese Laid-Open Patent Publication No. 2000-265202 discloses a conductor paste that can form a film conductor having a small heat shrinkage ratio during firing and a method for preparing an Ag powder that is the main component of the paste. Japanese Laid-Open Patent Publication No. 9-194668 discloses an Ag paste that can suppress occurrence or progress of solder leaching (typically, dissolution of Ag contained in the film conductor into a solder), that is, has a high resistance to soldering heat. Japanese Laid-Open Patent Publication No. 8-7644 discloses an Ag paste that can form a dense film conductor that is hardly detached from the ceramic substrate.

In the Ag pastes disclosed in the above-described publications, some of general properties that are desirable for the Ag paste to form a film conductor are improved, but they are not developed with individual and specific focus on each of the surface film conductor and the side film conductor of the ceramic electronic component shown in FIG. 9. Therefore, when a conventional Ag paste was used as it was without any attempt for improvement, it was difficult to achieve both of the following to a high extent: quality improvement required especially for the surface film conductor fired at the same time as the ceramic base material (e.g., improvement of the bond strength or prevention of excessive firing shrinkage stress); and quality improvement required especially for the side film conductor that is applied after the firing and then fired for printing (e.g., suppression of solder leaching or improvement of resistance to soldering heat). Furthermore, the Ag paste serving as one base was not used with sufficient consideration on whether it should be used to form a surface film conductor or a side film conductor by changing the composition as appropriate (including a change of the content ratio of a metal powder of the main component or selection of a substance to be added as a secondary component).

DISCLOSURE OF INVENTION

It is an object of the present invention to provide Ag pastes that can realize the improvement of the quality required for each of two types of film conductor (i.e., surface film conductor and side film conductor) that are applied onto a ceramic base material at different times and fired at different times, and a method for using the Ag pastes to realize such quality improvement (including selecting an appropriate paste of the pastes having different compositions). It is another object of the present invention to provide a ceramic electronic component having improved electrical characteristics and/or mechanical characteristics (typically, a multilayer ceramic capacitor (MLCC) and other multilayer ceramic circuit boards) and a method for producing the electronic component.

The present invention provides improved paste-like or ink-like Ag based conductor compositions (Ag pastes), and provides the following method for producing a ceramic electronic component using the same.

A production method provided by the present invention is a method for producing a ceramic electronic component comprising a ceramic base material, a surface film conductor (typically thick film conductor) formed on a surface of the base material, and a side film conductor (typically thick film conductor) formed on a surface adjacent to the surface. The production method of the present invention is characterized by forming the surface film conductor and the side film conductor with a conductor composition (paste or ink) containing a metal powder substantially constituted by Ag or an Ag based alloy (referred to as "Ag based metal powder") and an organic medium in which the metal powder is dispersed. In the conductor composition (Ag paste), the surface of the Ag based metal powder is coated with an organic metal compound having as a constituent element any one selected from the group consisting of aluminum (Al), zirconium (Zr), titanium (Ti), yttrium (Y), calcium (Ca), magnesium (Mg) and zinc (Zn) (this means that organic compounds containing various metals can be used and the presence or the absence of carbon-metal bonds does not matter, which applies to the following) or an oxide of the metal.

In the specification of the present application, a "ceramic electronic component" refers to an electronic component in general that has a ceramic base material, and typically, a laminate (multilayered substrate) of several ceramic circuit boards (wiring substrates). Therefore, hybrid ICs, multichip modules and ceramic circuit boards constituting them or ceramic capacitors (typically multilayer ceramic capacitors) or the like are typical examples encompassed in the "ceramic electronic component" defined in the present specification.

According to this production method, improvement of the quality required for these two types of film conductor (including conductor layers that can be called electrodes or wiring from the functional point of view, which applies to the following), for example, improvement of the bond strength with the ceramic base material, improvement of the resistance to soldering heat, and solder wettability or prevention of excessive firing shrinkage during firing (which matters, in particular, for formation of the surface film conductor, which is fired together with ceramic green materials) can be achieved.

In carrying out the production method of the present invention, it is preferable to use an Ag paste in which the coating amount of the organic metal compound or an oxide of the metal is an amount corresponding to 0.01 to 2.0 wt % of the Ag based metal powder in terms of the metal oxide (i.e., the weight in terms of the metal oxide (e.g., $Al_2O_3$ or $ZrO_2$) obtained when the organic metal compound is fired), and it is preferable to use an Ag paste in which the average particle size of the Ag based metal powder is 2.0 μm or less. It is particularly preferable to use an Ag paste in which the Ag based metal powder is coated with an organic acid metal salt, metal alkoxide or a chelate compound having as a constituent element any one selected from the group consisting of Al, Zr, Ti, Y, Ca, Mg and Zn as the organic metal compound, or an Ag paste in which the Ag based metal powder is coated with a metal oxide obtained by heating such an organic metal compound.

In one preferable embodiment of the present invention, the two film conductors are formed with two respective conductor compositions (Ag pastes) having different compositions. More specifically, the production method includes (a) forming the surface film conductor with a first conductor composition on a ceramic base material, and (b) forming the side film conductor with a second conductor composition on the ceramic base material. The first conductor composition and the second conductor composition contain Ag based metal powder substantially constituted by Ag or an Ag based alloy as the main component, and the surface of the Ag based metal powder is coated with an organic metal compound or a metal oxide having as a constituent metal element any one selected from the group consisting of Al, Zr, Ti, Y, Ca, Mg and Zn. Thus, the second conductor composition has at least one of the features (1) the coating amount of the organic metal compound or the metal oxide is smaller than that of the first conductor composition and/or (2) at least one inorganic oxide powder that is not contained in the first conductor composition is contained as a secondary component, or the content ratio of the inorganic oxide powder contained also in the first conductor composition is high.

In the production method, the two Ag pastes whose differences in the composition are (1) and (2) as described above are used appropriately either for surface film conductor formation (first conductor composition) or for side film conductor formation (second conductor composition). Thus, improvement of the quality required for the surface film conductor (e.g., to prevent excessive shrinkage during firing so as to improve the bond strength with the ceramic base material) and improvement of the quality required for the side film conductor (e.g., to suppress soldering leaching without a plating treatment and improve the resistance to soldering heat) both can be achieved to a high level.

In particular, it is preferable that an oxide constituting the inorganic oxide powder is at least one selected from the group consisting of copper oxide, lead oxide, bismuth oxide, manganese oxide, cobalt oxide, magnesium oxide, tantalum oxide, niobium oxide and tungsten oxide. The lead oxide can be optionally added as the inorganic oxide powder, but it is not essential component for producing the Ag paste. Therefore, the production method of the present invention typically can provide a lead-free (Pb less) ceramic electronic component.

It is particularly preferable that the first conductor composition substantially does not contain the inorganic oxide powder that is contained in the second conductor composition (i.e., the first conductor composition and the second conductor composition are different in whether or not that inorganic oxide powder is contained) to achieve quality improvement of the two film conductors to a high level.

It is preferable that the content ratio of the Ag based metal powder in the second conductor composition is lower than that of the Ag based metal powder in the first conductor composition. Furthermore, it is preferable that the average particle size of the Ag based metal powder contained in the second conductor composition is smaller than that of the Ag based metal powder contained in the first conductor composition.

The surface film conductor and the side film conductor are formed in the following order. It is preferable that as shown in FIG. 9, first, in the process (a), the process of attaching the first conductor composition (paste) on an unfired ceramic base material and the process of firing the ceramic base material on which the composition is attached are performed (cofiring), and then in the process (b), the process of attaching the second conductor composition on the side face (end face) of the ceramic base material after the firing process is performed and the process of firing the ceramic base material on which the composition is attached are performed. When the film conductors are formed in this order, by utilizing the Ag pastes of the present invention, the quality required for each of the surface film conductor and the side film conductor can be improved to a high level.

According to another aspect of the present invention, a ceramic electronic component that can produced by the production method of the present invention is provided.

A ceramic electronic component provided by the present invention includes a surface film conductor and a side film conductor comprising a metal substantially constituted by Ag or an Ag based alloy, and a metal oxide having as a constituent metal element any one selected from the group consisting of Al, Zr, Ti, Y. Ca, Mg and Zn for coating the metal. The side film conductor is characterized in that (1) the content ratio of the metal oxide is smaller than that of the surface film conductor and/or (2) at least one inorganic oxide that is different from the metal oxide used for the coating and is not contained in the surface film conductor is contained, or the content ratio of such an inorganic oxide also contained in the surface film conductor is high.

As such an inorganic oxide, at least one selected from the group consisting of copper oxide, lead oxide, bismuth oxide, manganese oxide, cobalt oxide, magnesium oxide, tantalum oxide, niobium oxide and tungsten oxide can be used.

According to another aspect of the present invention, the conductor composition (Ag paste) that can be used in the method for producing a ceramic electronic component of the present invention can be provided. For example, the Ag paste for surface film conductor formation and the Ag paste for side film conductor formation having different compositions from each other can be provided.

BRIEF DESCRIPTION OF DRAWINGS

FIG. 9(A) is shows a process of forming film conductors (inner film conductors) in a plurality of ceramic sheets; FIGS. 9(B) and 9(C) show a process of laminating and pressing of the ceramic sheets; FIG. 9(D) shows a process of forming a surface film conductor; FIG. 9(E) shows a process of forming side film conductors; FIG. 9F shows a plating treatment process; FIG. 9(G) shows a process of mounting electronic elements; and FIG. 9(H) shows a process of mounting the produced ceramic electronic components to a mother board.

BEST MODE FOR CARRYING OUT THE INVENTION

Figure 1:
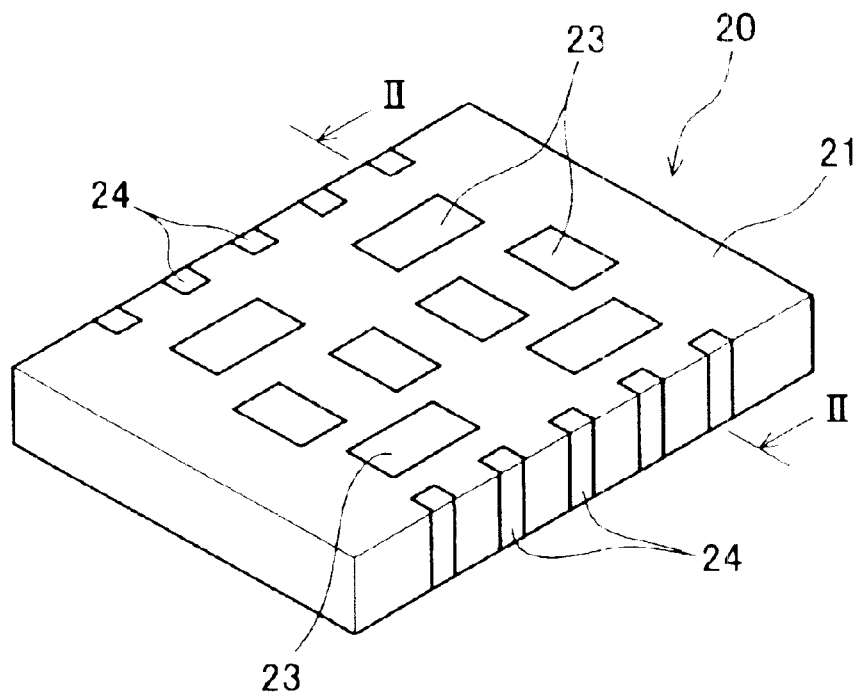
FIG. 1 is a schematic perspective view showing the typical appearance of a multilayer ceramic circuit board.

The Ag paste used to carry out the present invention is a paste for forming film conductors (electrodes, wiring or the like) characterized by comprising an Ag based metal powder as the main component, and there is no particular limitations regarding the type or the composition of other secondary components, as long as the above-described object can be achieved.

The Ag based metal powder is constituted with particles of Ag or an Ag based alloy (e.g., Ag—Au alloys, Ag—Pd alloys). As the Ag based particles, Ag alone or an Ag alloy having a specific resistance value (two terminal method) of about 1.8 to $5.0 \times 10^{-6}$ $\Omega \cdot cm$ (preferably 1.9 to $3.0 \times 10^{-6}$ $\Omega \cdot cm$, for example, $2.2 \times 10^{-6}$ $\Omega \cdot cm$) is preferably used in order to provide conductivity. Particles having an average particle size of 2.0 $\mu m$ or less (preferably 0.3 to 1.0 $\mu m$) are preferable to form a fired film having a dense structure, although not limited thereto. Ag based metal powder having a comparatively small average particle size and a comparatively narrow grain size distribution that contains substantially no particles having a particle size of 10 $\mu m$ or more (particularly preferably a particle size of 5 $\mu m$ or more) is particularly preferable.

When an oxide ceramic material such as alumina is used as the ceramic base material and a first conductor paste (hereinafter, referred to as "Ag paste for surface film conductor formation") and a second conductor paste (hereinafter, referred to as "Ag paste for side film conductor formation") are used, it is preferable that the particle size of the Ag based metal powder contained in the Ag paste for side film conductor formation is smaller than that of the Ag based metal powder contained in the Ag paste for surface film conductor formation, although it is not limited thereto. For example, when the average particle size of the Ag based metal powder contained in the Ag paste for surface film conductor formation is 0.5 $\mu m$ or more (typically 0.5 $\mu m$ or more, to less than 2.0 $\mu m$), the average particle size of the Ag based metal powder contained in the Ag paste for side film conductor formation is preferably less than 0.5 μm (typically 0.3 μm or more, to less than 0.5 μm). Thus, a surface conductor (external conductor layer) and a side conductor (end portion conductor layer) that are dense and have a lower resistance than that of regular surface conductors and side conductors.

The Ag based metal powder itself can be produced by a conventionally known method, and requires no special producing means. For example, Ag powder produced by well-known techniques such as reduction/precipitation, gas phase reaction and gas reduction can be preferably used.

Next, materials with which the Ag based-metal powder is coated will be described. There is no particular limitation regarding the organic metal compound used to coat the Ag based metal powder, as long as it eventually can form a coating film (that is, an attachment for coating the surface) of a metal (including a metal oxide or a reduced substance thereof) that can achieve the object of the present invention on the surface of the Ag based metal powder. However, organic metal salts, metal alkoxide or chelate compounds comprising as a constituent element any one selected from the group consisting of Al, Zr, Ti, Y, Ca, Mg and Zn can be used preferably.

Preferable examples of metal alkoxide includes titanium (IV) alkoxide such as tetrapropoxytitanium ($Ti(OC_3H_7)_4$), aluminum alkoxide such as aluminum ethoxide ($Al(OC_2H_5)_3$), aluminum t-butoxide ($Al(OC(CH_3)_3)_3$), acetoalkoxy aluminum diisopropylate, acetoalkoxy aluminum ethyl acetoacetate, and acetoalkoxy aluminum acetyl acetonate, zirconium alkoxide such as zirconium ethoxide, and zirconium butoxide, and various polynuclear alcoholate complexes having Zn, Mg, Ca or the like as the central metal atom (or ion). Preferable examples of chelate compounds include ethylene diamine (en) complexes, ethylene diamine tetraacetate (edta) complexes having Zn, Mg, Ca or the like as the central metal atom (or ion). Alternatively, so-called chelate resins in which a chelate is formed with metal (ion) such as Ti, Zn, Mg or the like are also preferable as the organic metal compounds (chelate compounds).

Other preferable examples of the organic metal compounds used to coat the Ag based metal powder include organic acid metal salts having as a constituent metal element any one selected from the group consisting of Al, Zr, Ti, Y, Ca, Mg and Zn. In particular, organic acid metal salts having Al or Zr as the main constituent metal element are preferable.

Particularly preferable organic acid metal salts are carboxylates having the above-listed elements as the main constituent metal element. For example, compounds Al, Ca, Ti, Y or Zr and organic acid such as various fatty acids (e.g., naphthenic acid, octyl acid, ethyl hexanoic acid), abietic acid, naphthoic acid or the like are preferably used. Particularly preferable organic acid metal salts are compounds of Al or Zr and carboxylic acid (in particular fatty acid).

When the Ag based metal powder coated with such an organic metal compound is subjected to a heat treatment (typically 350 to 700° C.), a coating film of a metal oxide (alumina, zirconia or the like) that is an oxide of the organic metal compound is formed on the surface of the Ag based metal powder (particles). Alternatively, such a metal oxide can be obtained by firing the coated Ag based metal powder together with the ceramic base material. Therefore, it is not essential to previously subject the Ag based metal power (i.e., the paste including the powder) coated with an organic metal compound to a heat treatment before attaching it to the ceramic base material.

Alternatively, instead of the organic metal compound, various oxide sols (typically alumina sol, zirconia sol or the like) can be used as the coating material of the Ag based metal powder of the present invention. In this case, the surface of the Ag based metal powder is coated directly with a metal compound (oxide) such as alumina, zirconium or the like.

Thus, a film conductor (conductor layer) formed of the Ag based metal powder coated with the organic metal compound having the above composition or an oxide of the metal has a particularly high resistance to soldering heat and high bond strength after firing (after an oxide of the metal is produced in the case where the organic metal compound is coated). Therefore, when the Ag paste of the present invention is used, a film conductor (surface film conductor, side film conductor or inner film conductor) having resistance to soldering heat or bond strength that is sufficient in practical use can be formed on the ceramic base material without using a large amount of expensive precious metals such as Pd and without performing a complicated plating treatment.

Next, a method for coating the surface of the Ag based metal powder with the organic metal compound or an oxide of the metal will be described.

In performing the production method of the present invention, it is preferable that the surface of the Ag based metal powder is coated substantially uniformly and evenly with the organic metal compound or an oxide of the metal, but there is no particular limitation regarding the coating method. For example, conventionally used methods for coating metal particles with an organic substance can be used as they are. For example, first, a desired organic metal compound is dissolved or dispersed in a suitable organic solvent such as toluene, xylene, or various alcohols. Then, the Ag based metal powder is added to the obtained solution or dispersion (sol) and dispersed or suspended therein. This suspension is left undisturbed or stirred for a predetermined time so that the surface of the Ag based metal powder in the suspension can be coated with the desired organic metal compound. In this case, it is preferable that the Ag based metal powder is coated with the desired compound such that the coating amount of the organic metal compound or an oxide of the metal becomes the amount corresponding to 0.01 to 2.0 wt % (typically 0.0125 to 1.0 wt %) of the Ag based metal powder in terms of the oxide, although it is not limited thereto. When the coating amount is smaller than the amount corresponding to 0.01 wt % of the Ag based metal powder in terms of the oxide, the coating effect is too small, so that the object of the present invention is hardly achieved. On the other hand, when the coating amount is excessively larger than the amount corresponding to 2.0 to 3.0 wt % of the Ag based metal powder in terms of the oxide, various functions inherent in the Ag based metal powder such as electrical properties may be impaired, so that these amounts are not preferable.

In particular, in the Ag paste for surface film conductor formation, it is preferable that the coating amount is the amount corresponding to 0.025 to 2.0 wt % of the Ag based metal powder in terms of the oxide. When the coating substance after firing is alumina, that is, the Ag based metal powder is coated with an organic metal compound such as an organic acid metal salt, metal alkoxide, or chelate compounds having Al as a constituent element or alumina (aluminum oxide) itself, it is particularly preferable that the coating amount is the amount corresponding to 0.1 to 2.0 wt % (e.g., 0.2 to 1.0 wt %) of the Ag based metal powder in terms of the oxide. In the case of the Ag paste for surface film conductor formation and when the coating substance after firing is zirconia, that is, the Ag based metal powder is coated with an organic acid metal compound such as an organic metal salt, metal alkoxide, or chelate compounds having Zr as a constituent element or zirconia (zirconium oxide) itself, it is particularly preferable that the coating amount is the amount corresponding to 0.025 to 1.0 wt % (e.g., 0.025 to 0.5 wt %) of the Ag based metal powder in terms of the oxide.

With the Ag paste in such a coating amount, excessive shrinkage hardly occurs during firing, and the difference in the firing shrinkage ratio between the ceramic base material (alumina, zirconia or the like) and the film conductor is prevented from occurring. Therefore, a ceramic electronic component having excellent bond characteristics without significant structural defects such as peeling or cracks can be produced. Such an Ag paste also can be used preferably for inner film conductor formation.

For the Ag paste for side film conductor formation, it is preferable that the coating amount is the amount corresponding to 0.01 to 1.0 wt % of the Ag based metal powder in terms of the oxide, although it is not limited thereto. When the coating substance after firing is alumina, that is, the Ag based metal powder is coated with an organic metal compound such as an organic acid metal salt, metal alkoxide, or chelate compounds having Al as a constituent element or alumina (aluminum oxide) itself, it is particularly preferable that the coating amount is the amount corresponding to 0.01 to 1.0 wt % (e.g., 0.0125 to 0.1 wt %) of the Ag based metal powder in terms of the oxide. In the case of the Ag paste for side film conductor formation and when the coating substance after firing is zirconia, that is, the Ag based metal powder is coated with an organic metal compound such as an organic acid metal salt, metal alkoxide, or chelate compounds having Zr as a constituent element or zirconia (zirconium oxide) itself, it is particularly preferable that the coating amount is the amount corresponding to 0.025 to 1.0 wt % (e.g., 0.025 to 0.5 wt %) of the Ag based metal powder in terms of the oxide.

Then, preferable substances for the secondary components to be contained in the Ag paste will be described. A principal secondary component can be an organic medium (vehicle) in which the above-described metal powder is dispersed. In performing the present invention, such an organic vehicle can be any vehicle, as long as the metal powder can be dispersed, and any vehicle used for conventional conductor paste can be used without any limitations. For example, organic solvents having a high boiling point, such as cellulose polymer such as ethyl cellulose, ethylene glycol and diethylene glycol derivatives, toluene, xylene, mineral spirit, butyl carbitol, and terpineol can be used.

In the Ag paste, various inorganic additives can be contained as secondary components, as long as the conductivity (low resistivity), solder wettability, resistance to soldering heat, bond strength that are inherent in the paste are not significantly impaired. For example, as such an inorganic additive, inorganic oxide power, various fillers or the like can be used.

In particular, the inorganic oxide powder contributes to improvement of the bond strength between the ceramic base material and the film conductor. Furthermore, the inorganic oxide powder can prevent excessive shrinkage from occurring during firing of the film conductor. Therefore, it can contribute to maintaining the precision or the mechanical strength of ceramic electronic components to be produced at a high level in practical use. As such inorganic oxides, metal oxide powder such as copper oxide, lead oxide, bismuth oxide, manganese oxide, cobalt oxide, magnesium oxide, tantalum oxide, niobium oxide, or tungsten oxide are particularly preferable. Among these, copper oxide, lead oxide and bismuth oxide are particularly preferable. In particular, bismuth oxide can accelerate sintering of the Ag based metal powder and can reduce the viscosity of the Ag paste so as to improve the wettability with the ceramic base material (alumina or the like), and therefore it is a particularly preferable inorganic oxide. Copper oxide can improve the adherence to the substrate.

When adding the metal oxide powder as a secondary component, a powder having an average particle size (typically a value obtained by measurement according to a light scattering technique or the BET adsorption method) of 5 $\mu$m or less (typically 0.1 to 5 $\mu$m, for example, 1 to 5 $\mu$m, and 1 $\mu$m or less is also preferable) is preferable for optimization of the filling ratio and the dispersibility of the paste. Regarding the specific surface area (value obtained according to the BET adsorption method), a powder having a specific surface area of at least 0.5 m$^2$/g is preferable, and a powder having a specific surface area of 1.0 m$^2$/g or more is particularly preferable (typically about. 1.0 to 2.0 m$^2$/g, but more preferably 2.0 to 100 m$^2$/g).

Other than the above-described metal oxide powder, various oxide glass powders can be used as a preferable inorganic oxide powder as a secondary component of the Ag paste. The oxide glass powder can be an inorganic component (inorganic binding material) that contributes to stable firing and secure printing of the paste component attached onto the ceramic base material (i.e., improvement of the bond strength). It is preferable that an oxide glass powder having a softening point of about 800° C. or less in terms of the relationship with the firing temperature, which will be described later. Examples of such a glass powder include lead-based, zinc-based and borosilicate-based glass, typically at least one glass powder selected from the group consisting of PbO—SiO$_2$—B$_2$O$_3$ glass, PbO—SiO$_2$—B$_2$O$_3$—Al$_2$O$_3$ glass, ZnO—SiO$_2$ glass, ZnO—B$_2$O$_3$—SiO$_2$ glass, Bi$_2$O$_3$—SiO$_2$ glass and Bi$_2$O$_3$—B$_2$O$_3$—SiO$_2$ glass. It is preferable that a glass powder to be used has a specific surface area (values obtained according to the BET method) of about 0.5 to 50 m$^2$/g, and a powder having an average particle size (typically a value obtained by measurement according to a light scattering technique or the BET method) of 2 $\mu$m or less (for example, 0.1 to 2 $\mu$m, in particular, about 1 $\mu$m or less, for example, 0.1 to 1 $\mu$m) is particularly preferable.

In the Ag paste, various organic additives can be contained as secondary components, as long as the conductivity (low resistivity), the solder wettability, the resistance to soldering heat, the bond strength and the like that are inherent in the paste are not significantly impaired. For example, as such an organic additive, various organic binders, various coupling agents such as silicon-based, titanate-based and aluminum-based coupling agents for the purpose of improving the adherence to the ceramic base material or the like can be used.

As the organic binders, for example, organic binders based on acrylic resins, epoxy resins, phenol resins, alkyd resins, cellulose based polymers, polyvinyl alcohol or the like can be used. Those that can provide a good viscosity and an ability of forming a coating film (an adhesion film to the base material) to the conductor paste of the present invention are preferable. When it is desired to provide photo-curing properties (photosensitivity) to the conductor paste of the present invention, various photopolymerizable compounds and photopolymerization initiator may be added as appropriate.

Other than above, if necessary, a surfactant, an antifoamer, a plasticizer, a thickener, an antioxidant, a dispersing agent, a polymerization inhibitor or the like can be added as appropriate. These additives can be any additive, as long as it can be used to prepare a conventional conductor paste, and will not be described in detail.

Then, preparation of the conductor composition (Ag paste) will be described. The Ag paste described herein can be prepared easily by mixing the Ag based metal powder (typically Ag alone) coated with the organic metal compound or an oxide of the metal, as described above, and an organic medium (vehicle). In this case, if necessary, the above-described additives can be added and mixed. For example, the Ag based metal powder and various additives are directly mixed in a predetermined mixing ratio together with an organic vehicle and kneaded, using a three-roll mill or other kneading machines.

It is preferable that the materials are kneaded such that the content ratio of the Ag based metal powder coated with at least one organic metal compound or an oxide of the metal is 60 to 95 wt % of the entire conductor composition (paste), although the present invention is not thereto. For the Ag paste for surface film conductor formation, it is preferable that the materials are kneaded such that this content ratio is 60 to 80 wt % (more preferably 65 to 75 wt %). For the Ag paste for side film conductor formation, it is preferable that the materials are kneaded such that this content ratio is 75 to 95 wt % (more preferably 80 to 90 wt %).

The amount of the organic vehicle added to be used for paste preparation is preferably about 1 to 40 wt %, and particularly preferably 1 to 20 wt % of the entire paste.

When producing a ceramic electronic component with an oxide ceramic material such as alumina for the ceramic base material and with the Ag paste for surface film conductor formation and the Ag paste for side film conductor formation, it is preferable that the content ratio of the Ag based metal powder in the Ag paste for side film conductor formation is lower than that of the Ag based metal powder in the Ag paste for surface film conductor formation.

When adding the metal oxide powder and/or the oxide glass powder as the inorganic oxide powder, it is preferable to add it in an amount of about 5.0 wt % or less (e.g., 0.001 to 5.0 wt %), more preferably 2.0 wt % or less (e.g., 0.005 to 2.0 wt %) of the weight of the Ag based metal powder. With this small amount, the bond strength of the fired product (film-like conductor) obtained from the paste of the present invention with respect to the ceramic base material can be improved, and the firing shrinkage can be suppressed, substantially without impairing good conductivity and the solder wettability of the Ag paste of the present invention.

The improvement of the bond strength matters especially to the side film conductor (terminal electrodes or the like). Therefore, when producing a ceramic electronic component with an oxide ceramic material such as alumina for the ceramic base material and with the Ag paste for surface film conductor formation and the Ag paste for side film conductor formation, it is preferable that the Ag paste for side film conductor formation contains an inorganic oxide powder as a secondary component in a comparatively high content ratio. On the other hand, the Ag paste for surface film conductor formation does not necessarily contain such an inorganic oxide powder, and even if an inorganic oxide powder is contained for the purpose of improving the bond strength, the content ratio may be lower than that of the inorganic oxide powder in the Ag paste for side film conductor formation. For example, when the Ag paste for side film conductor formation contains an inorganic oxide powder such as bismuth oxide or copper oxide, it is preferable that the content ratio is 0.001 to 5.0 wt %, more preferably 0.005 to 2.0 wt %, of the Ag based metal powder. On the other hand, it is preferable that the Ag paste for surface film conductor formation contains substantially no inorganic oxide powder or that the content ratio thereof is less than 0.01 wt % of the Ag based metal powder. In particular, containing a comparatively large amount of an oxide glass powder may cause the conductor resistance to increase.

It should be noted that the range of the values of the content ratio, the mixing ratio and the like of the Ag paste as described above should not be strictly construed, but can depart from the range as long as the object of the present invention can be achieved.

The Ag paste disclosed herein can be handled in the same manner as the conductor paste conventionally used to form a film conductor such as wiring or electrodes on a ceramic base material. In other words, in the production method of the present invention, the above-described Ag paste is adopted as a conductor paste to be used, and conventionally known materials or methods can be used as other materials to be used or treatment methods (a method for preparing the ceramic base material, a method for applying the paste, a firing method or the like) without particular limitations.

Typically, the Ag paste is attached onto alumina or other ceramic base material by screen printing or dispenser coating or the like in a desired shape and thickness. Then, preferably after being dried, the attached paste component is fired (printed) and cured by being heated in a heater under suitable heating conditions (typically, the maximum firing temperature is about 500 to 960° C., preferably the temperature range that does not exceed the melting point of Ag, for example, 700 to 960° C., particularly 800 to 900° C.) for a predetermined time. This series of operations provides a ceramic electronic component (e.g., hybrid ICs or ceramic circuit boards for multichip module construction) in which desired film conductors (wiring, electrodes, etc.) are formed. The production method of the present invention is useful particularly for producing multilayer (laminated) ceramic electronic components (a multilayer circuit board such as MLCC).

Thus, by using this ceramic electronic component as an assembling material and applying a conventionally known construction method, an even more advanced ceramic electronic component (hybrid ICs, multichip modules) can be obtained.

Figure 2:
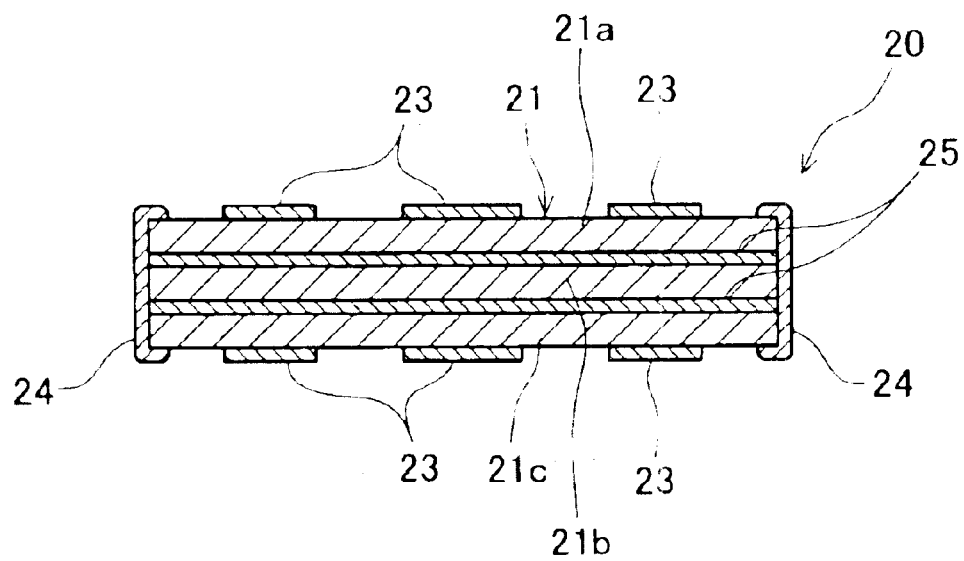
FIG. 2 is a cross-sectional view taken along line 11—11 in FIG. 1.
Figure 9:
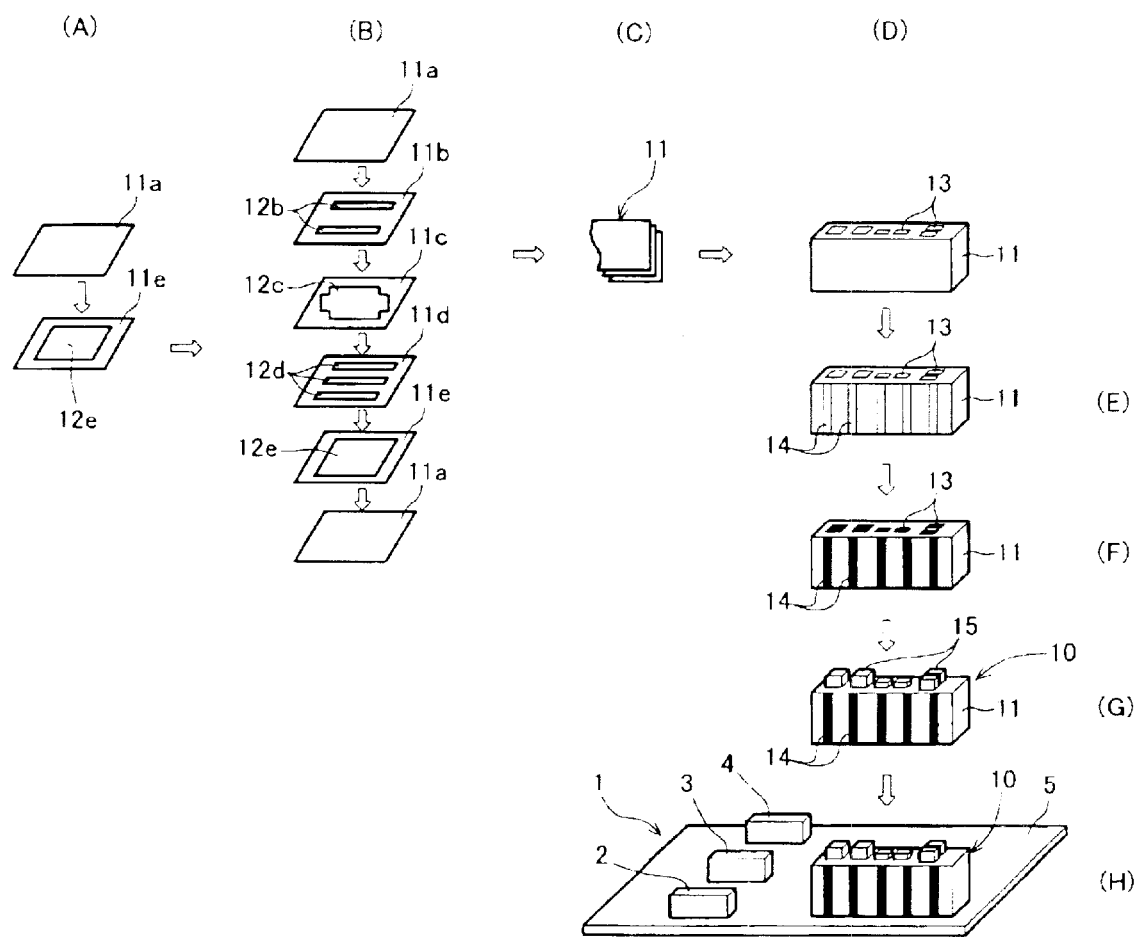
FIGS. 9A to 9H are schematic flow diagrams showing the production procedure of a commonly used multilayer ceramic electronic component.

For example, the multilayer ceramic circuit board 20 (e.g., a ceramic electronic component for high-frequency applications constituting a resonant circuit portion of a mobile telephone or the like) schematically shown in FIGS. 1 and 2 can be produced by performing the work processes shown in FIG. 9 described above. That is, film conductors (inner film conductors) 25 that form an inner wiring pattern of the multilayer circuit board 20 are formed by applying the predetermined conductor paste onto a plurality of ceramic base materials (green sheets) 21a, 21b, and 21c. The film conductors also can be formed in via-holes, that is, holes (not shown) for connecting different layers of the multilayer ceramic circuit board (multilayered printed circuit board), if necessary. The above-described paste for surface film conductor formation can be used to form such inner film conductors 25.

The plurality of green sheets 21a, 21b, and 21c provided with the film conductors are laminated and pressed. Then, the Ag paste for surface film conductor formation is applied onto the surface (external surface) of the obtained laminate 21, so that surface film conductors (external conductor layers) 23 can be formed. The surface film conductor 23 can be formed on the surfaces of the green sheets 21a and 21c that are the outermost layers previously before lamination. Then, the laminate 21 provided with the surface film conductors 23 are fired typically in a predetermined temperature range that does not exceed the melting point of Ag. After firing, the Ag paste for side film conductor formation is applied so as to form side film conductors (end conductor layers) 24, and the side film conductors 24 are fired for printing by being heated to a predetermined temperature range. There is no particular limitation, but if the Ag paste disclosed herein is used, the film conductors 23, 24, and 25 have better resistance to soldering heat (which can be evaluated, for example, whether or not there is a change (swelling, bending, etc.) in the appearance of the film conductors after immersion in a solder bath) or better bond strength than conventional film conductors. For this reason, not only a thick film conductor having a thickness of about 10 to 30 μm, but also a comparatively thin film conductor having a thickness of 10 μm or less (e.g., 1 to 10 g m, typically 5 to 10 μm) can be formed.

This series of processes provides the multilayer ceramic circuit board 20 shown in FIGS. 1 and 2. A desired ceramic electronic component can be produced by mounting various electronic elements on the surface of this circuit board 20 and/or forming dielectric layers such as glass layers on the surface film conductors 23, which are not shown in the drawings.

There is no limitation regarding the application, but if the Ag paste disclosed herein is used, film conductors having better resistance to soldering heat and better bond strength than when conventional conductor pastes are used can be formed. Therefore, according to the production method of the present invention, typically, the plating treatment shown in FIG. 9(F) can be omitted.

Hereinafter, some examples of the present invention will be described, but the present invention is not limited thereto.

PRODUCTION EXAMPLE 1

Preparation of Ag Paste for Side Film Conductor Formation

Five types of Ag paste for side film conductor formation having compositions shown as No. 1 to No. 5 in Table 1 were prepared.

As the Ag based metal powder, a spherical Ag powder having an average particle size of 0.3 to 0.5 μm (except No. 2) or 0.6 to 0.8 μm (No. 2) that was prepared by a general wet process was used. As the coating material, aluminum alkoxide (acetoalkoxy aluminum diisopropylate) was used in No. 1 to No. 3, and zirconium alkoxide (zirconium butoxide) was used in No. 4 and No. 5. Thus, the metal alkoxide was added to a suitable organic solvent (methanol in this example) and thus a coating solution having a concentration of 5 to 100 g/l was prepared. Then, the Ag powder was suspended in a suitable amount in the solution, and was kept suspended for 1 to 3 hours while being stirred as appropriated. Thereafter, the Ag powder was collected, and dried by ventilation at 60 to 110° C.

By the process described above, Ag powders (hereinafter, referred to as "coated Ag powder") in which the surface was coated substantially uniformly with aluminum alkoxide or zirconium alkoxide in an amount of about 0.0125 to 0.1 wt % (Nos. 1 to 3), 0.025 to 0.5 wt % (No. 4) or 0.05 to 1 wt % (No. 5) of the Ag powder in terms of the oxide ($Al_2O_3$ or $ZrO_2$) were obtained. The coating amount can be adjusted easily by adjusting the concentration of the metal alkoxide of the coating solution and, if necessary, the suspension time of the Ag powder, as appropriate.

For preparation of the Ag paste for side film conductor formation, a copper oxide ($Cu_2O$ or $CuO$) powder having an average particle size of 1 to 5 μm and a specific surface area of 0.5 to 1.5 $m^2/g$ and a bismuth oxide ($Bi_2O_3$) powder having an average particle size of 1 to 10 μm and a specific surface area of 0.5 to 2.0 $m^2/g$ were used as the inorganic oxide powder.

Thus, the coated Ag powder having a final concentration (weight ratio) of 65 to 75 wt %, a bismuth oxide powder in an amount corresponding to 0.01 to 1.0 wt % (Nos. 1 to 3) or 0.02 to 2.0 wt % (Nos. 4 and 5) of the coated Ag powder, a copper oxide powder in an amount corresponding to 0.005 to 0.5 wt % (Nos. 1 to 3) or 0.01 to 1.0 wt % (Nos. 4 and 5) of the coated Ag powder, an organic binder (ethyl cellulose) in an amount corresponding to 1.5 to 10 wt % of the coated Ag powder, and a solvent, that is, a mixed solvent of BC (butyl carbitol, or diethylene glycol monobutyl ether) and terpineol for Nos. 1 and 2, and a mixed solvent of BC and another ester (more specifically, trimethyl pentadiol monoisobutylate) for Nos. 3 to 5, in the remaining amount were kneaded with a three-roll mill after the materials were scaled for the above amounts. Thus, five types of Ag paste shown in Table 1 were obtained.

TABLE 1

| Ag paste for side film conductor formation | No. 1 | No. 2 | No. 3 | No. 4 | No. 5 |
| --- | --- | --- | --- | --- | --- |
| Ag average particle size (μm) | 0.3~0.5 | 0.6~0.8 | 0.3~0.5 | 0.3~0.5 | 0.3~0.5 |
| Ag powder content ratio (%) | 65~75 | 65~75 | 65~75 | 65~75 | 65~75 |
| coating substance (after firing) | $Al_2O_3$ | $Al_2O_3$ | $Al_2O_3$ | $ZrO_2$ | $ZrO_2$ |
| coating amount (Ag ratio %) | 0.0125~0.1 | 0.0125~0.1 | 0.0125~0.1 | 0.025~0.5 | 0.05~1 |
| resin (organic binder: Ag ratio %) | 1.5~10 | 1.5~10 | 1.5~10 | 1.5~10 | 1.5~10 |
| solvent | BC + terpineol | BC + terpineol | BC + ester | BC + ester | BC + ester |
| inorganic oxide added and the | $Bi_2O_3$ 0.01~1.0 | $Bi_2O_3$ 0.01~1.0 | $Bi_2O_3$ 0.01~1.0 | $Bi_2O_3$ 0.02~2.0 | $Bi_2O_3$ 0.02~2.0 |

TABLE 1-continued

| Ag paste for side film conductor formation | No. 1 | No. 2 | No. 3 | No. 4 | No. 5 |
|---|---|---|---|---|---|
| amount (Ag ratio %) | $Cu_2O$ 0.005~0.5 | $Cu_2O$ 0.005~0.5 | $Cu_2O$ 0.005~0.5 | $Cu_2O$ 0.01~1.0 | $Cu_2O$ 0.01~1.0 |
| viscosity (Pa · s) | | | | | |
| 1 T | 190 | 200 | 220 | 120 | 130 |
| 10 T | 49.0 | 53.0 | 58.0 | 44.0 | 44.0 |
| 100 T | 18.3 | 18.0 | 18.1 | 17.7 | 16.7 |
| viscosity ratio | | | | | |
| 1/10 | 3.88 | 3.77 | 3.79 | 2.73 | 2.95 |
| 1/100 | 10.38 | 11.11 | 12.15 | 6.78 | 7.78 |
| dry density (g/cm$^3$) | 5.63 | 5.13 | 6.03 | 7.00 | 6.49 |
| shrinkage ratio (%) | | | | | |
| 700° C. | −18.1 | −17.3 | −16.9 | −16.3 | −13.5 |
| 900° C. | −16.5 | −20.8 | −12.9 | −14.8 | −14.6 |

PRODUCTION EXAMPLE 2

Preparation of Ag Paste for Surface Film Conductor Formation

Twelve types of Ag paste for surface film conductor formation having compositions shown as No. 11 to No. 22 in Tables 2 to 4 were prepared.

The same type of Ag powder and metal alkoxide as used in Production Example 1 were used. That is, Ag powders having an average particle size of 0.3 to 0.5% m for Nos. 16, 17, 20 to 22; an average particle size of 0.6 to 0.8 μm for Nos. 11, 14, 15, 18 and 19; an average particle size of 0.8 to 1.0 μm for No. 12; an average particle size of 1.5 to 2.0 μm for No. 13 were used. Acetoalkoxy aluminum diisopropylate was used for Nos. 11, 14 to 19, 21 and 22, and zirconium butoxide was used for Nos. 12, 13 and 20.

Thus, coating solutions having a metal alkoxide concentration of 5 to 100 g/l were prepared, and the same treatments as in Production Example 1 were performed. Then, coated Ag powders in which the surface was coated substantially uniformly with aluminum alkoxide or zirconium alkoxide in an amount of about 0.025 to 0.4 wt % of the Ag powder in terms of the oxide ($Al_2O_3$ or $ZrO_2$) were obtained.

Then, the obtained coated Ag powders were used to prepare conductor pastes. That is, twelve types of Ag paste were obtained by performing the same treatments as in Production Example 1, using the coated Ag powder in an amount that provided a final paste concentration (weight ratio) of 83 to 86 wt % and the secondary components shown in Tables 2 to 4 (inorganic oxide, organic binder, solvent or the like) as appropriate. As seen from Tables 2 to 4, one feature of these Ag pastes for surface film conductor formation is that the content ratios of the Ag powder are higher than those of the Ag pastes for side film conductor formation of Table 1. Another feature is that inorganic oxide powder (bismuth oxide and copper oxide) is not contained in the Ag pastes of Nos. 11 to 19. On the other hand, the Ag pastes of Nos. 20 to 22 contain these inorganic oxide powder in a comparatively high ratio. The content ratio (ratio % with respect to Ag) of the organic binder (ethyl cellulose) and the type of the solvent used to produce each paste are shown in Tables 2 to 4. For preparation of the pastes of Nos. 15 and 17, a trace amount of a dispersing agent (amine based agents in this example) was mixed (Tables 2 and 3).

TABLE 2

| Ag paste for surface film conductor formation | No. 11 | No. 12 | No. 13 | No. 14 | No. 15 |
|---|---|---|---|---|---|
| Ag average particle size (μm) | 0.6~0.8 | 0.8~1.0 | 1.5~2.0 | 0.6~0.8 | 0.6~0.8 |
| Ag powder content ratio (%) | 85.0 | 85.6 | 85.0 | 83.4 | 84.8 |
| coating substance (after firing) | $Al_2O_3$ | $ZrO_2$ | $ZrO_2$ | $Al_2O_3$ | $Al_2O_3$ |
| coating amount (Ag ratio %) | 0.1 | 0.025 | 0.025 | 0.2 | 0.4 |
| resin (organic binder: Ag ratio %) | 1.8 | 1.8 | 1.8 | 1.8 | 1.8 |
| solvent | BC | BC | BC | BC | BC |
| inorganic oxide added and the amount(Ag ratio %) | no addition | no addition | no addition | no addition | no addition |

TABLE 2-continued

| Ag paste for surface film conductor formation | No. 11 | No. 12 | No. 13 | No. 14 | No. 15 |
|---|---|---|---|---|---|
| dispersant (Ag ratio %) | no addition | no addition | no addition | no addition | 0.35 |
| viscosity (Pa · s) | | | | | |
| 10 T | 200 | 192 | 216 | 249.5 | 220.4 |
| 50 T | 116 | 94.2 | 95.3 | 165.5 | 170 |
| 100 T | 87 | 70 | 69.2 | 74.2 | 92.4 |
| dry density (g/cm³) | 5.89 | 6.26 | 5.74 | 5.51 | 5.04 |
| shrinkage ratio (%) | | | | | |
| 700° C. | −7.05 | −3.5 | 0 | −3.8 | −2.4 |
| 900° C. | −18.7 | −18.2 | −0.2 | −16 | −17.5 |

TABLE 3

| Ag paste for surface film conductor formation | No. 16 | No. 17 | No. 18 | No. 19 |
|---|---|---|---|---|
| Ag average particle size (μm) | 0.3 ~ 0.5 | 0.3 ~ 0.5 | 0.6 ~ 0.8 | 0.6 ~ 0.8 |
| Ag powder content ratio (%) | 83.9 | 84.7 | 85.0 | 84.7 |
| coating substance (after firing) | $Al_2O_3$ | $Al_2O_3$ | $Al_2O_3$ | $Al_2O_3$ |
| coating amount (Ag ratio %) | 0.1 | 0.05 | 0.025 | 0.05 |
| resin (organic binder: Ag ratio %) | 1.8 | 1.8 | 1.8 | 1.8 |
| solvent | BC | BC | BC | BC |
| inorganic oxide added and the amount (Ag ratio %) | no addition | no addition | no addition | no addition |
| dispersant (Ag ratio %) | no addition | 0.2 | no addition | no addition |
| viscosity (Pa · s) | | | | |
| 10T | 278 | 231 | 235 | 221 |
| 50T | 96.9 | 110 | 127.6 | 124.8 |
| 100T | 64.3 | 74.5 | 90.7 | 91.2 |
| dry density (g/cm³) | 5.75 | 5.41 | 5.72 | 5.60 |
| shrinkage ratio (%) | | | | |
| 700° C. | −7.5 | −18.4 | −17.0 | −13.8 |
| 900° C. | −16.8 | −17.7 | −18.1 | −18.0 |

TABLE 4

| Ag paste for surface film conductor formation | No. 20 | No. 21 | No. 22 |
|---|---|---|---|
| Ag average particle size (μm) | 0.3 ~ 0.5 | 0.3 ~ 0.5 | 0.3 ~ 0.5 |
| Ag powder content ratio (%) | 83.1 | 85.8 | 85.7 |
| coating substance (after firing) | $ZrO_2$ | $Al_2O_3$ | $Al_2O_3$ |
| coating amount (Ag ratio %) | 0.05 | 0.1 | 0.2 |
| resin (organic binder: Ag ratio %) | 2.3 | 2.3 | 2.3 |
| solvent | BC + ester | BC + ester | BC + ester |
| inorganic oxide added and the amount (Ag ratio %) | $Bi_2O_3$ 0.5 $Cu_2O$ 0.25 | $Bi_2O_3$ 1.0 $Cu_2O$ 0.5 | $Bi_2O_3$ 1.0 $Cu_2O$ 0.5 |
| dispersant (Ag ratio %) | no addition | 0.3 | 0.6 |
| viscosity (Pa · s) | | | |
| 10T | 275 | 269 | 240 |
| 50T | 90 | 114 | 106 |
| 100T | 57.6 | 80.0 | 68.7 |
| dry density (g/cm³) | 5.95 | 5.51 | 5.30 |
| shrinkage ratio (%) | | | |
| 700° C. | −15.9 | −15.6 | −12.2 |
| 900° C. | −11.9 | −12.8 | −14.2 |

<Performance Evaluation of Ag Pastes>

The viscosity (Pa's) and the viscosity ratio of these Ag pastes were measured using a regular rotational viscometer (Model DV3 manufactured by Brook Field Co.) and a rotor (Model SC4-14 manufactured by Brook Field Co.). The results are shown in the corresponding fields in Tables 1 to 4. 1T, 10T, 50T and 100T indicate the viscosity at 1 rpm, 10 rpm, 50 rpm and 100 rpm, respectively.

As seen from Table 1, the Ag pastes for side film conductor formation have a low viscosity. In particular, the pastes having a large amount of bismuth oxide (Nos. 4 and 5) have a low viscosity. Therefore, with these Ag pastes for side film conductor formation, precise screen printing or the like can be performed well even with respect to a fine chip shaped ceramic substrate.

On the other hand, as seen from Tables 2 to 4, the Ag pastes for surface film conductor formation have a higher viscosity than those of the Ag pastes for side film conductor formation, and suitable to be applied (printed) onto the surface of the substrate or to fill through-holes. In addition, since the content ratio of the Ag powder is high, the conductivity resistance of the film conductor can be suppressed low.

The dry density (g/cm³) of the film conductor formed with each Ag paste was measured. More specifically, a film conductor was printed in a size of 30 mm×20 mm on an alumina substrate whose weight was previously measured. Then, a dry treatment was performed at 100 to 120° C. for about 10 minutes. Such a printing treatment and a drying treatment were repeated so that 3 to 5 printed films were superimposed one after another. Then, the weight of this printed substrate was measured, and the weight of the alumina substrate was subtracted from the measurement value (weight of the printed substrate) so that the weight (the weight of the dry paste) of the printed layer was obtained. At the same time, the thickness of the printed layer was measured with a surface roughness meter or the like, and the volume of the printed layer was calculated based on the thickness. The dry density was derived from (the weight of the printed layer)/(the volume of the printed layer).

The obtained results are shown in the corresponding fields in Tables 1 to 4. All the Ag pastes can form a film conductor having a good dry density (i.e., film conductor having a low conductivity resistance).

The shrinkage ratio (%) when a film conductor is formed of each Ag paste was investigated. More specifically, each Ag paste was applied onto the surface of an alumina ceramic sheet having a thickness of about 1 mm according to general screen printing (film thickness: 10 to 30 μm), and was subjected to a firing treatment at the maximum temperature of 950° C. The change in the shrinkage, that is, the degree of decrease in the volume (shrinkage volume percentage:–%) on the ceramic sheet at 700° C. and 900° C. when compared with that at room temperature (before firing) was investigated based on the thermomechanical analysis (TMA).

The obtained results are shown in the corresponding fields in Tables 1 to 4. All the Ag pastes exhibited a comparatively low shrinkage (0 to –21%). In particular, the shrinkage ratios of the Ag pastes for surface film conductor formation Nos. 11 to 16 at 700° C. are within 0 to –10%. This indicates that in simultaneous firing with the ceramic base material, substantially no difference in the shrinkage ratio between the ceramic base material (alumina or the like) and the film conductor formed in its surface and/or its inner surface is generated. Therefore, by using these Ag pastes to form a surface film conductor or by using these Ag pastes to form an inner film conductor when a multilayer ceramic circuit board is produced, an excessive difference in the shrinkage ratio between the film conductor and the ceramic base material at the time of simultaneous firing can be prevented from occurring, and as a result, a ceramic electronic component having excellent bond characteristics between the ceramic base material and the film conductor without significant structural defects can be produced.

Figure 3A:
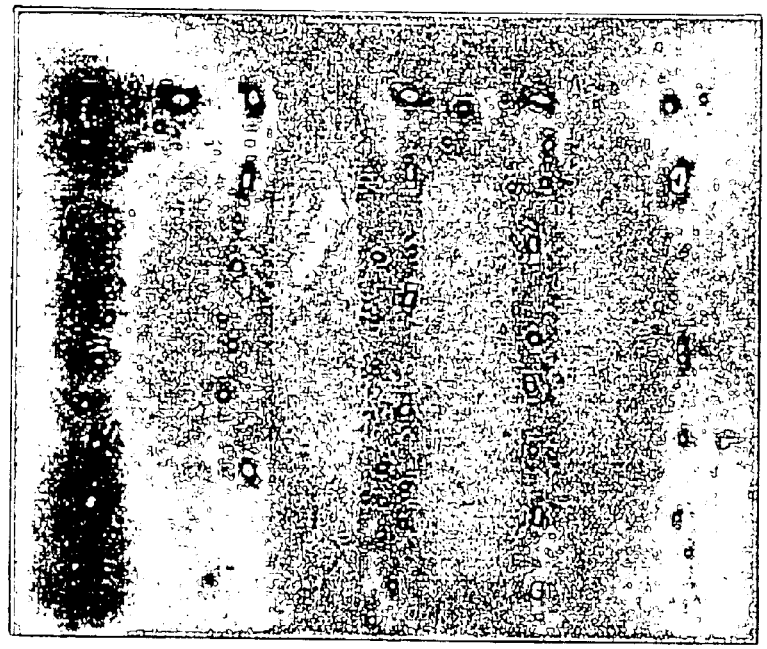
FIG. 3A is a photograph showing the state after a high temperature firing treatment of the surface of a ceramic substrate to which a conventional Ag paste is applied.
Figure 3B:
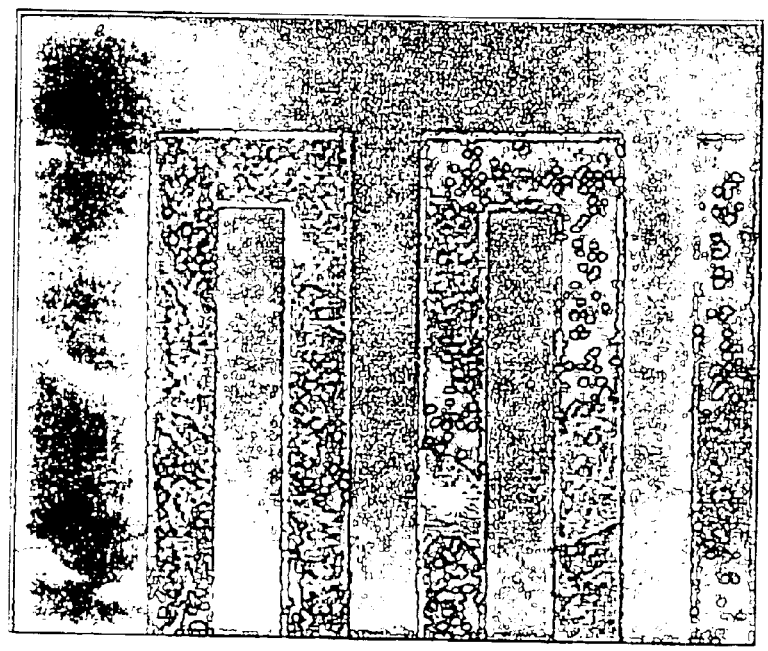
FIG. 3B is a photograph showing the state after a high temperature firing treatment of the surface of a ceramic substrate to which the Ag paste of the present invention is applied.

Furthermore, the heat resistance of these Ag pastes was investigated. More specifically, the Ag paste No. 1 obtained in Production Example 1 was applied onto an alumina ceramic substrate, and was subjected to a firing treatment at a temperature of 950° C. for one hour. For comparison, a ceramic substrate onto which a conventional conductor paste having a Ag powder whose surface is not coated with the organic metal compound or the metal oxide as the main component (hereinafter, referred to as "conventional Ag paste") was applied was subjected to a firing treatment under the same conditions. FIGS. 3A and 3B show photographs of the surface of the ceramic substrate after such a firing treatment. As seen from these photographs, in the ceramic substrate onto which the conventional Ag paste was applied, peeling and evaporation of the film conductor were significant (see FIG. 3A). On the other hand, in the ceramic substrate onto which the Ag paste obtained in Production Example 1 was applied, no significant peeling, evaporation or foaming was not observed, and a good film conductor (sintered product) was formed and maintained (see FIG. 3B). This confirmed that the Ag paste obtained in Production Example 1 can be used for firing at a comparatively high temperature, although it is a conductor paste having an Ag based metal powder as the main component.

<Production (1) of Ceramic Circuit Board>

Next, as Example 1, a film conductor having a predetermined pattern (see FIG. 4) was formed on the surface of a ceramic base material (an alumina substrate having a thickness of about 2.0 mm), using the Ag paste for surface film conductor produced in Production Example 2. More specifically, the Ag paste No. 11 shown in Table 2 was applied onto the surface of the ceramic substrate according to general screen printing, and a coating film having a thickness of 10 to 30 μm was formed. Then, a drying treatment was performed with a dryer using far infrared radiation at 100° C. for 15 minutes. This drying treatment volatilized the solvent from the coating film, and thus an unfired film conductor was formed on the ceramic substrate.

Then, this film conductor together with the ceramic substrate were fired in an electrical furnace at 700° C. for one hour. With this firing treatment, a ceramic circuit board on which the film conductor having the predetermined pattern was attached (see the photograph of Example 1 of FIG. 4).

As a comparative example, the same treatment was performed, using a conventional Ag paste (Comparative Example 1), a conventional conductor paste (Comparative Example 2) containing an alloy powder of Ag and Pd in a ratio of 80/20 as the main component, and a conventional conductor paste (Comparative Example 3) containing an alloy powder of Ag and Pt in a ratio of 99.5/0.5 as the main component so as to produce ceramic circuit boards on which film conductors having the same shape were attached.

The ceramic circuit boards of Example 1 and Comparative Examples 1 and 2 were tested and measured regarding the resistance to soldering heat in the following manner.

Figure 4:
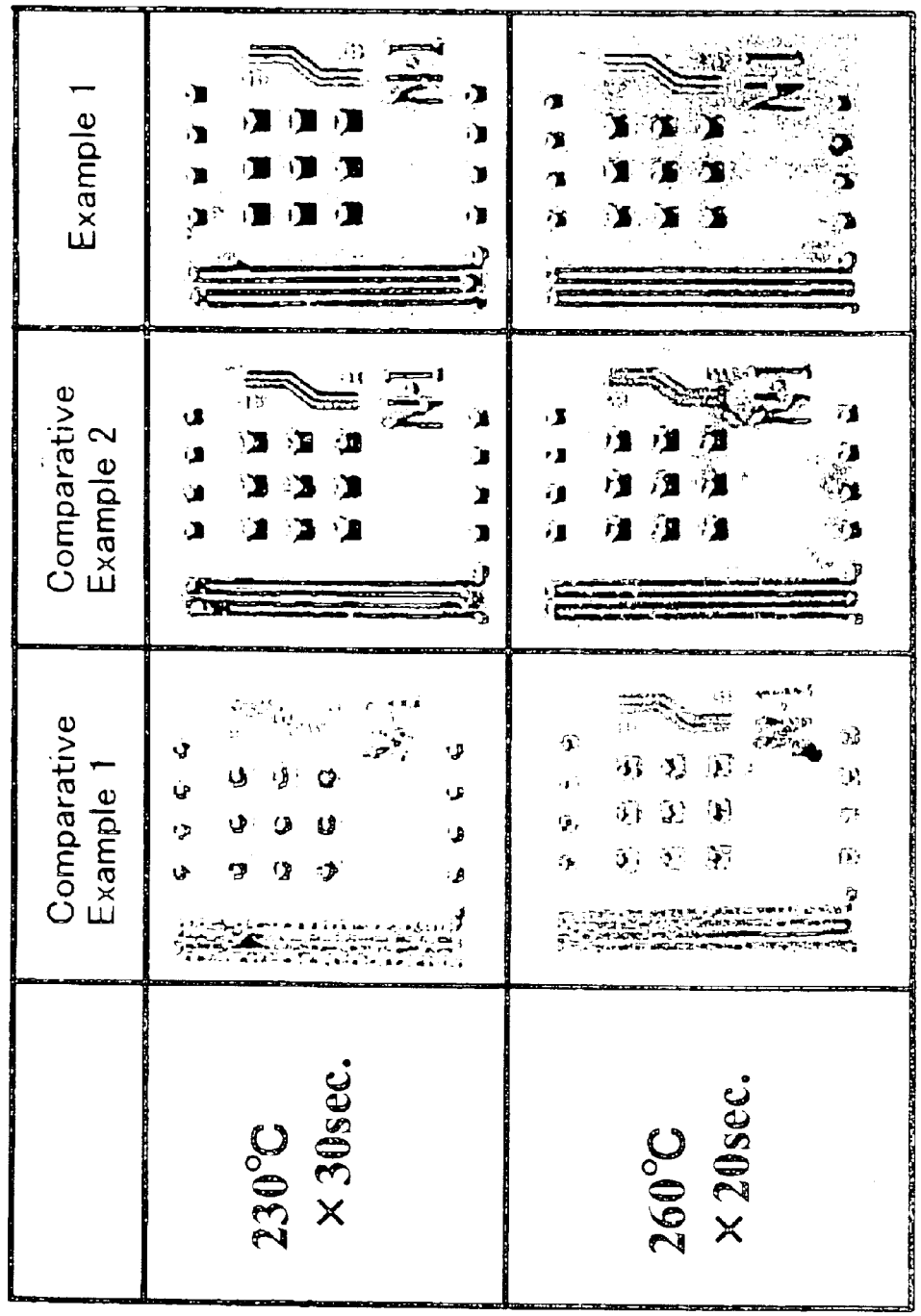
FIG. 4 is a photograph showing the state after the surface (film conductor) of the ceramic substrate after the ceramic circuit boards of Example 1 and Comparative Examples 1 and 2 provided with a film conductor are immersed in a melted solder.

A rosin flux was applied to a portion of the ceramic substrate on which a film conductor is to be formed, and then the substrate was immersed in a solder (Sn/Pb=60/40 (weight ratio)) having a predetermined temperature for a predetermined time. In this example, the soldering temperature and the immersing time were 230±5° C.×30 seconds, and 260±5° C.×20 seconds. FIG. 4 shows the photographs of the surface of the ceramic substrate after such immersion. As seen from the photographs of these surfaces, for the film conductor of Example 1, so-called "soldering leaching" substantially did not occur under either conditions. For the film conductor of Comparative Example 2 formed of the Ag/Pd alloy, almost no soldering leaching occurred. On the other hand, for the film conductor of Comparative Example 1 formed of the conventional Ag alone whose surface was not coated, significant soldering leaching occurred, and 30% or more of the film conductor was lost compared with before immersion.

Thus, according to the present invention, although the film conductor is formed of a conductor paste containing Ag alone as the main component, the resistance to soldering heat equal to or more than that of the film conductor formed of an Ag/Pd alloy without performing a plating treatment such as Ni plating, solder plating or the like.

<Production (2) of Ceramic Circuit Board>

As Examples 2 to 6, the same ceramic circuit boards as in Example 1 were produced using the Ag pastes for side film conductor formation produced in Production Example 1. The ceramic circuit boards obtained using the Ag pastes Nos. 1, 2, 3, 4, and 5 were denoted as Examples 2, 3, 4, 5, and 6, respectively.

The obtained film conductors of Examples 2 to 6 were measured regarding the bond strength (kg/2 mm (square)□) with respect to the ceramic substrate based on the following tensile strength tests.

Figure 5:
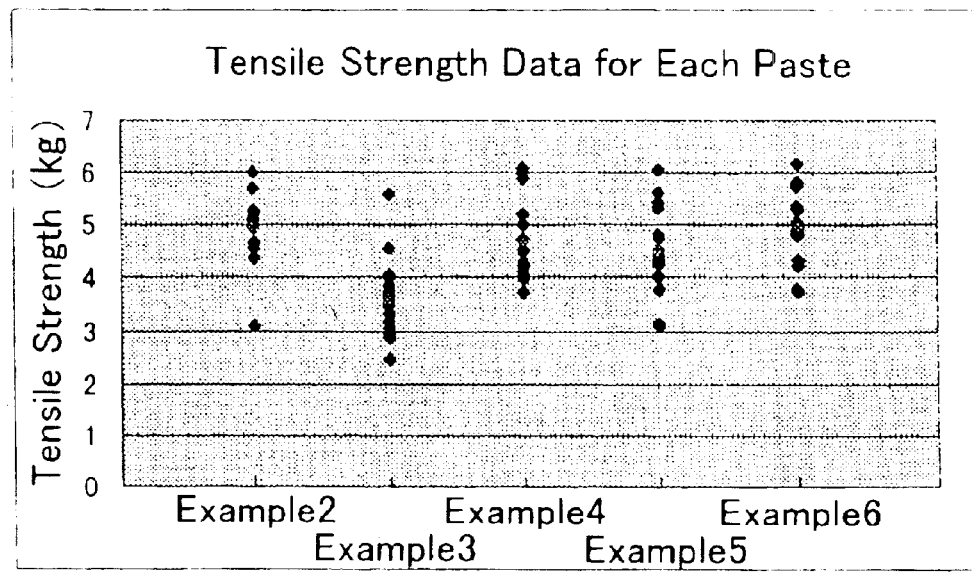
FIG. 5 is a graph showing the bond strength of each film conductor of Examples 2 to 6 with respect to the ceramic base material.

More specifically, a lead wire (tin plated copper wire) was soldered with a rectangular film conductor of 2 mm×2 mm formed on the ceramic substrate. The lead wire was pulled by a predetermined force to the direction perpendicular to the plane direction of the substrate, and the load (kg) at the time when the jointed surface is broken (split) was used as the bond strength (tensile strength). FIG. 5 shows the results. As seen from this graph, it was confirmed that all the film conductors of the examples had a high bond strength.

<Production of Ceramic Electronic Components for High-Frequency Applications>

Next, the Ag pastes for side film conductor formation Nos. 1 to 5 shown in Table 1 and the Ag paste for surface film conductor formation No. 11 shown in Table 2 were used to produce ceramic electronic components for high-frequency applications (chip modules for high-frequency applications) having a general shape shown in FIGS. 1 and 2.

More specifically, according to the procedure shown in FIG. 9, film conductors corresponding to inner film conductors were formed by screen-printing the Ag paste for surface film conductor formation No. 11 on a plurality of alumina ceramic sheets, and they were laminated and attached by pressing. Then, film conductors corresponding to surface film conductors were formed by screen-printing this paste on the surface of the laminate. Thereafter, the obtained laminate was fired at 900° C. After firing, side film conductors (terminal electrodes) were formed of any one of the Ag pastes for side film conductor formation Nos. 1 to 5 and fired at 800 to 900° C. so that the side film conductors were printed. Thereafter, the predetermined elements were mounted on the surface on which the surface film contactors were formed so that a desired chip module for high-frequency was obtained. The chip modules for high-frequency obtained using the Ag pastes for side film conductor formation Nos. 1, 2, 3, 4, and 5 were denoted as Examples 7, 8, 9, 10, and 11, respectively.

Furthermore, as Comparative Example 4, a chip module for high-frequency in which various film conductors were formed of the conventional Ag paste was produced. In this module of Comparative Example 4, a plating treatment routinely performed in production of this art as shown in FIG. 9(F) was performed with respect to the surface film conductors and the side film conductors.

Figure 6:
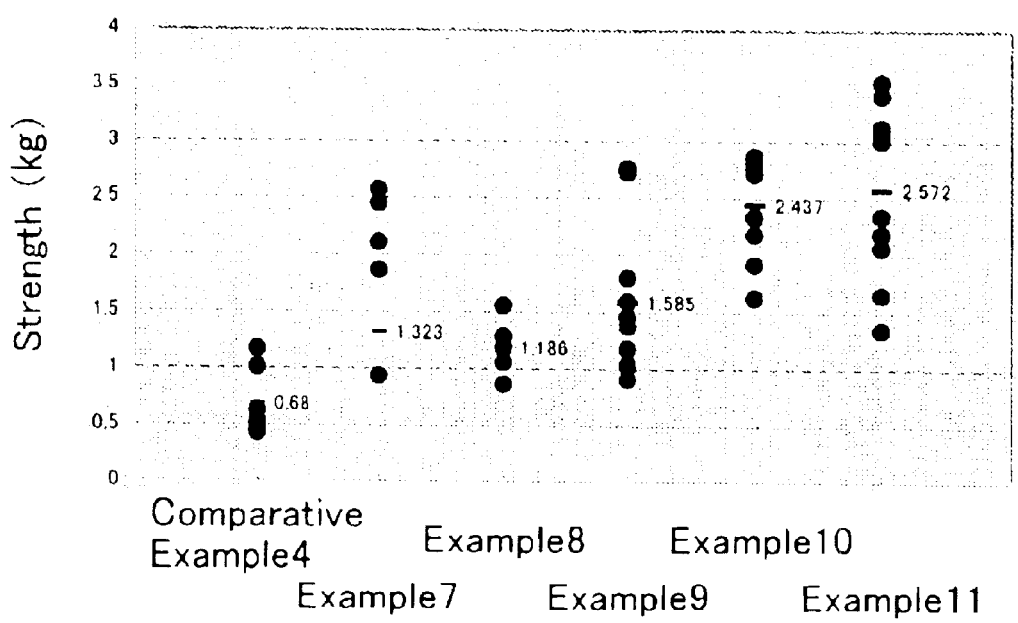
FIG. 6 is a graph showing the bond strength of the side film conductor (terminal electrode) of a chip module for high-frequency applications of Examples 7 to 11 and Comparative Example 4 with respect to the ceramic base material.
Figure 7:
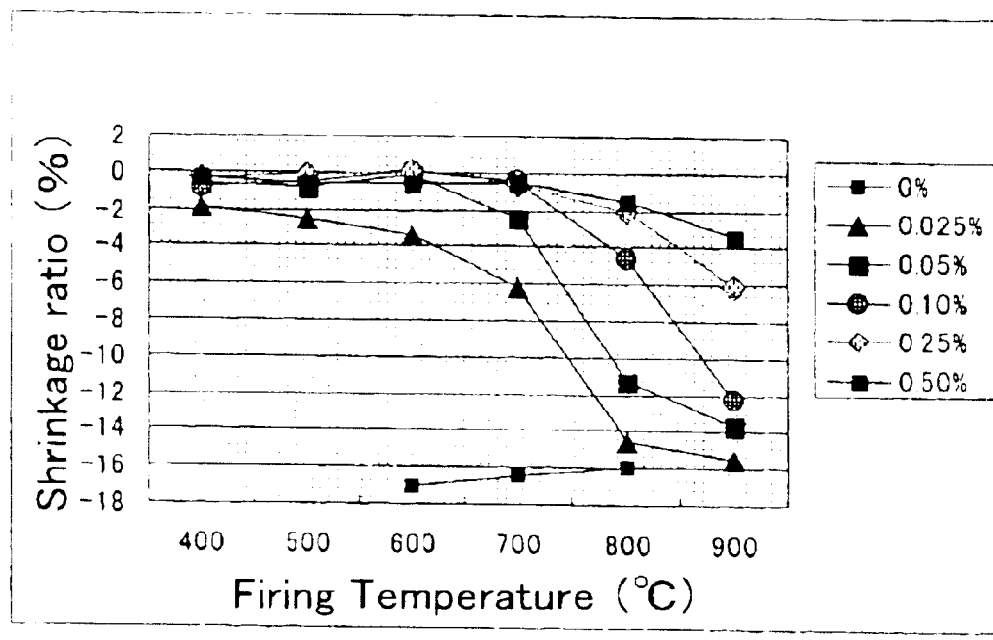
FIG. 7 is a graph showing the amount of coated organic metal salt and/or the firing temperature and the firing shrinkage ratio in one test example.

The side film conductors (terminal electrodes) of the obtained chip modules for high-frequency of Examples 7 to 11 and Comparative Example 4 were subjected to the above-mentioned tensile strength tests. FIG. 6 shows the results. As seen from this graph, all the terminal electrodes of the examples have higher bond strength than that of the terminal electrode (electrode subjected to a conventionally plating treatment) of Comparative Example 4.

The electrical characteristics (insertion loss, isolation or the like) of the chip modules for high-frequency of the examples were equal to that of the chip module for high-frequency of the comparative example.

Furthermore, the solder wettability of the side film conductors (terminal electrodes) of the chip modules for high-frequency of Examples 7 to 11 was investigated in the following manner. More specifically, a rosin flux was applied to each side film conductor and then the modules were immersed in a solder (Sn/Pb=60/40 (weight ratio)) having 230±5° C. for three seconds. Thereafter, the solder wettability was evaluated using the area ratio of the film conductor wetted with the solder. As a result, 90% or more of the surface of the film conductor was wetted and good solder wettability was exhibited.

Furthermore, the resistance to soldering heat of the side film conductors (terminal electrodes) of the chip modules for high-frequency of Examples 7 to 11 was investigated in the following manner. More specifically, a rosin flux was applied to each side film conductor and then the modules were immersed in a solder (Sn/Pb=60/40 (weight ratio)) having 230±5° C. for 30 seconds. After immersion, the resistance to soldering heat was evaluated using the area ratio of the portion in which "soldering leaching" did not occur, that is, the side film conductor that remained after immersion, compared with before immersion. As a result, 90% or more of the side film conductor remained, and good resistance to soldering heat was exhibited.

TEST EXAMPLE 1

As Test Example 1 relevant to the present invention, the relationship between the coating amount of the organic metal salt and/or the firing temperature and the firing shrinkage ratio was examined.

More specifically, the same treatment as in the production examples was performed, and six types of Ag paste (containing no inorganic oxide powder) in which Ag powder having an average particle size of 0.8 to 1.0 $\mu$m was dispersed in a solvent (BC) such that the content ratio thereof was 85 wt % and the coating amount of aluminum alkoxide was 0 to 0.5 wt % of the Ag powder in terms of the oxide ($Al_2O_3$) were prepared.

These pastes were applied to the surface of an alumina ceramic sheet in the same manner as described in the section <Performance evaluation of Ag pastes>, a firing treatment was performed at 400 to 900° C. and the shrinkage ratio (%) was obtained. Table 7 shows the results. In the above-described range, as the coating amount increased, the shrinkage ratio decreased. It was confirmed that especially in those having a coating amount of 0.1% or more, a low shrinkage ratio was maintained, even if the firing treatment was performed at 800° C. or 900° C.

TEST EXAMPLE 2

As Test Example 2 relevant to the present invention, the relationship between the type and the amount of added inorganic oxide powder and the bond strength (tensile strength) was examined.

More specifically, the same treatment as in the production examples was performed, and Ag pastes in which Ag powder having an average particle size of 0.8 to 1.0 $\mu$m that was coated with aluminum alkoxide in an amount of 0.1 wt % of the Ag powder in terms of the oxide ($Al_2O_3$) was dispersed in a solvent (BC) such that the content ratio thereof was 85 wt % were prepared. In this test example, nine Ag pastes containing bismuth oxide, copper oxide, or glass oxide ($Bi_2O_3$—$B_2O_3$—$SiO_2$ based glass) in an amount corresponding to 0.25 wt %, 0.5 wt % or 1 wt % of the Ag powder were prepared.

Figure 8:
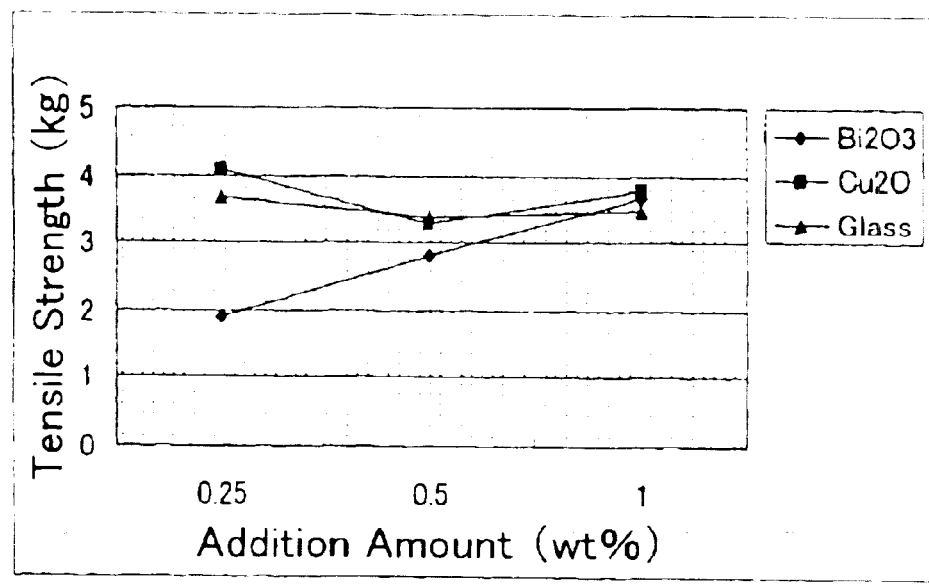
FIG. 8 is a graph showing the type and the amount of inorganic oxide powder added and the bond strength (tensile strength) in one test example.

Using these pastes, the same ceramic circuit boards as in Example 1 were produced, and subjected to the above-described tensile strength tests. FIG. 8 shows the results. As seen from the graph, it was confirmed that all the film conductors formed of the Ag pastes have high bond strength.

In the above examples and test examples, specific examples of the present invention have been described, but they are only illustrative and not limiting the scope of the claims. All changes and modifications from the specific examples illustrated above are intended to be embraced in the techniques disclosed in the appended claims.

The technical elements described in the specification or the drawings can exhibit technical usefulness, either alone or in combination, and combinations are not limited to those described in the claims as filed. The techniques illustrated in the specification or the drawings can achieve a plurality of purposes at the same time, and achieving only one of them has technical usefulness.

As described above, according to the present invention, Ag pastes that can form a surface film conductor (external conductor layer) and/or a side film conductor (end conductor layer) having excellent firing shrinkage properties, bond strength, resistance to soldering heat, solder wettability and the like can be provided. According to the production method of the present invention, a multilayer ceramic circuit board and other ceramic electronic components in which film conductors having high electrical reliability and high mechanical strength are formed can be produced and provided to the market.

What is claimed is:

1. A method for producing a ceramic electronic component comprising a ceramic base material, a surface film conductor formed on a surface of the base material, and a side film conductor formed on a surface adjacent to the surface, comprising:

(a) forming a surface film conductor on the ceramic base material with a first conductor composition containing a metal powder substantially constituted by particles of Ag or an Ag based alloy whose surface is coated with at least one organic metal compound or metal oxide having as a constituent metal element any one selected from the group consisting of Al, Zr, Ti, Y, Ca, Mg and Zn, and an organic medium in which the metal powder is dispersed; and (b) forming a side film conductor on the ceramic base material with a second conductor composition containing a metal powder substantially constituted by particles of Ag or an Ag based alloy whose surface is coated with at least one organic metal compound or metal oxide having as a constituent metal element any one selected from the group consisting of Al, Zr, Ti, Y, Ca, Mg and Zn, and an organic medium in which the metal powder is dispersed; the second conductor composition being characterized in that (1) a coating amount of the organic metal compound or the metal oxide is smaller than that of the first conductor composition and/or (2) at least one inorganic oxide powder that is not contained in the first conductor composition is contained as a secondary component, or a content ratio of an inorganic oxide powder contained also in the first conductor composition is high.

2. The production method according to claim 1, wherein
   the coating amount of the organic metal compound or the metal oxide with respect to the metal powder of the first conductor composition is an amount corresponding to 0.025 to 2.0 wt % of the metal powder in terms of the oxide, and
   the coating amount of the organic metal compound or the metal oxide with respect to the metal powder of the second conductor composition is an amount corresponding to 0.01 to 1.0 wt % of the metal powder in terms of the oxide provided that the amount is not more than the coating amount with respect to the metal powder of the first conductor composition.

3. The production method according to claim 1, wherein
   an oxide constituting the inorganic oxide powder is at least one selected from the group consisting of copper oxide, lead oxide, bismuth oxide, manganese oxide, cobalt oxide, magnesium oxide, tantalum oxide, niobium oxide and tungsten oxide.

4. The production method according to claim 1, wherein
   the inorganic oxide powder is substantially not contained in the first conductor composition.

5. The production method according to claim 1, wherein
   a content ratio of the metal powder in the second conductor composition is lower than that of the metal powder in the first conductor composition.

6. The production method according to claim 5, wherein
   the content ratio of the metal powder in the entire first conductor composition is 80 to 90 wt %, and the content ratio of the metal powder in the entire second conductor composition is 65 to 75 wt %.

7. The production method according to claim 1, wherein
   the average particle size of the metal powder contained in the second conductor composition is smaller than the average particle size of the metal powder contained in the first conductor composition.

8. The production method according to claim 7, wherein
   the average particle size of the metal powder contained in the first conductor composition is 0.5 $\mu$m or more to 2.0 $\mu$m or less, and the average particle size of the metal powder contained in the second conductor composition is 0.3 $\mu$m or more to 0.5 $\mu$m or less.

9. The production method according to claim 1, wherein
   the organic metal compound is an organic acid metal salt, metal alkoxide or a chelate compound having as a constituent metal element any one selected from the group consisting of Al, Zr, Ti, Y, Ca, Mg and Zn.

10. A ceramic electronic component comprising:
    a ceramic base material;
    a surface film conductor formed on a surface of the base material, comprising a metal substantially constituted by Ag or an Ag based alloy, and a metal oxide having as a constituent metal element any one selected from the group consisting of Al, Zr, Ti, Y, Ca, Mg and Zn with which the metal is coated; and
    a side film conductor formed on a surface adjacent to the surface, comprising a metal substantially constituted by Ag or an Ag based alloy, and a metal oxide having as a constituent metal element any one selected from the group consisting of Al, Zr, Ti, Y, Ca, Mg and Zn with which the metal is coated, the side film conductor being characterized in that (1) a content ratio of the metal oxide is smaller than that of the metal oxide of the surface film conductor and/or (2) at least one inorganic oxide that is not contained in the surface film conductor and is different from the metal oxide of the surface film conductor, or a content ratio of an inorganic oxide contained also in the surface film conductor is high.

11. The ceramic electronic component according to claim 10, wherein
    the inorganic oxide is at least one selected from the group consisting of copper oxide, lead oxide, bismuth oxide, manganese oxide, cobalt oxide, magnesium oxide, tantalum oxide, niobium oxide and tungsten oxide.

12. The ceramic electronic component according to claim 10, wherein
    the inorganic oxide powder is substantially not contained in the surface film conductor.

13. The ceramic electronic component produced by the production method according to claim 1.

* * * * *